(12) United States Patent
Happer et al.

(10) Patent No.: US 7,323,941 B1
(45) Date of Patent: *Jan. 29, 2008

(54) METHOD AND SYSTEM FOR OPERATING A LASER SELF-MODULATED AT ALKALI-METAL ATOM HYPERFINE FREQUENCY

(75) Inventors: William Happer, Princeton, NJ (US); Yuan-Yu Jau, Princeton, NJ (US)

(73) Assignee: Princeton University, Princeton, NJ (US)

( * ) Notice: Subject to any disclaimer, the term of this patent is extended or adjusted under 35 U.S.C. 154(b) by 151 days.

This patent is subject to a terminal disclaimer.

(21) Appl. No.: 11/284,064

(22) Filed: Nov. 21, 2005

Related U.S. Application Data

(63) Continuation-in-part of application No. 11/052,261, filed on Feb. 7, 2005, now Pat. No. 7,102,451.

(60) Provisional application No. 60/630,024, filed on Nov. 22, 2004, provisional application No. 60/545,359, filed on Feb. 18, 2004.

(51) Int. Cl.
*H03L 7/26* (2006.01)

(52) U.S. Cl. .......................................... 331/3; 331/94.1

(58) Field of Classification Search ............... 331/3, 331/94.1
See application file for complete search history.

(56) References Cited

U.S. PATENT DOCUMENTS

| | | |
|---|---|---|
| 3,718,868 A | 2/1973 | Pao et al. |
| 4,345,475 A * | 8/1982 | Bickel ........................ 73/657 |
| 2005/0212607 A1 | 9/2005 | Happer et al. ............. 331/94.1 |

OTHER PUBLICATIONS

Vanier, J., et al., "Contrast and Linewidth of the Coherent Population Trapping Transmission Hyperfine Resonance Line in 87Rb: Effect of Optical Pumping", Physical Review A, vol. 67, pp. 065801-1-0865801-4, (2003).

Nikonov, D.E., et al., "Atomic Coherence Effects Within the Sodium D1, Manifold: II. Coherent Optical Pumping", Quantum Opt., vol. 6, pp. 245-260, (1994).

Bell, W.E., et al., "Optical Detection of Magnetic Resonance in Alkali Metal Vapor", Physical Review, vol. 107, No. 6, pp. 1559-1566, (1957).

Bell, W.E., et al., "Optically Driven Spin Precession", Physical Review Letters, vol. 6, No. 6, pp. 280-281, (1961).

* cited by examiner

*Primary Examiner*—David Mis
(74) *Attorney, Agent, or Firm*—Mathews, Shepherd, McKay & Bruneau, P.A.

(57) ABSTRACT

The present invention provides a method and apparatus for making atomic clocks or atomic magnetometers as self-modulated laser systems based on the physics of push-pull optical pumping. An atomic vapor cell is required to be in the laser cavity. With proper conditions, spontaneous push-pull optical pumping can occur inside the laser cavity. This causes the laser beam to be modulated at hyperfine-resonance frequency. With a fast photodetector, the modulated laser signal can be converted into the electrical signal, which serves as the atomic clock ticking signal or magnetometer signal. The self-modulated laser system does not use any local oscillator and the microwave circuit to lock the oscillator frequency to the hyperfine-resonance frequency, and therefore can consume less power and become more compact than conventional systems. This invention will benefit applications of time measurements and magnetic-field measurements.

52 Claims, 12 Drawing Sheets

METHOD AND SYSTEM FOR OPERATING A LASER SELF-MODULATED AT ALKALI-METAL ATOM HYPERFINE FREQUENCY

CROSS REFERENCE TO RELATED APPLICATION

This application is a continuation-in-part of U.S. patent application Ser. No. 11/052,261 filed Feb. 7, 2005, now U.S. Pat. No. 7,102,451, claiming priority to U.S. Provisional Application No. 60/545,359, filed on Feb. 18, 2004, and this application claims priority to U.S. Provisional Application No. 60/630,024, filed on Nov. 22, 2004, the disclosure of each application is hereby incorporated by reference in its entirety.

STATEMENT OF GOVERNMENT FUNDED RESEARCH

This work was supported by the Air Force Office Scientific Research FA9550-04-1-0199. Accordingly, the Government has certain rights in this invention.

BACKGROUND OF THE INVENTION

1. Field of the Invention

The present invention relates to the field of optically pumped atomic clocks, optically pumped atomic magnetometers, pulse laser systems, and more particularly to a laser that is self-modulated by alkali-metal vapor at 0-0 atomic-clock frequency by using light of alternating polarization referred to as push-pull optical pumping technique.

2. Description of the Related Art

Gas-cell atomic clocks and magnetometers use optically pumped alkali-metal vapors. Atomic clocks are applied in various systems that require extremely accurate frequency measurements. Atomic magnetometers are utilized in magnetic field detection with extremely high sensitivity. For example, atomic clocks are used in GPS (global positioning system) satellites and other navigation systems, as well as in high-speed digital communication systems, scientific experiments, and military applications. Magnetometers are used in medical systems, scientific experiments, industry and military applications.

A vapor cell used in atomic clocks or magnetometers contains a few droplets of alkali metal, such as potassium, rubidium, or cesium. A buffer gas, such as nitrogen, other noble gases, or a mixture thereof, is required to be filled inside the cell to match the spectral profile of the pumping light, suppress the radiation trapping, and diminish alkali-metal atoms diffusing to the cell wall. The gas cell is heated up to above room temperature to produce sufficient alkali-metal vapor. The resonances of alkali-metal ground-state hyperfine sublevels are especially useful for atomic clocks and atomic magnetometers. The hyperfine resonance is excited by rf (radio frequency) fields, microwave fields, or modulated light (CPT: coherent population trapping method). The resonance is probed by the laser beam. As shown in FIG. 1, hyperfine 0-0 resonance, $v_{00}$, is particularly interesting for atomic clocks because of its insensitivity of the magnetic field at low field regime; hyperfine end resonance, $v_{end}$, can be used either for atomic clocks and magnetometers; the Zeeman end resonance, $v_z$, is usually used for a magnetometer because of its high sensitivity of the magnetic field. Besides the three illustrative resonances, other resonances of different hyperfine sublevels can also be used for atomic clocks and magnetometers. The resonance signal is reflected on the probing beam as a transmission dip or a transmission peak when the frequency is scanned through the resonance frequency. Conventionally, an atomic clock or a magnetometer measures the frequency at the maximum response of the atomic resonance. A local oscillator is required to generate the oscillation signal and excite the resonance. For a passive-type atomic clock, the frequency of the local oscillator is locked to the peak resonance as shown in FIG. 2. A precise clock ticking signal is therefore provided by the output of the local oscillator.

The development of atomic clocks and magnetometers is heading in the direction of low power consumption and compact size. To reduce the size and the complexity of the atomic clocks, the CPT method has been introduced for the atomic clock to get rid of microwave cavity. The conventional CPT method with fixed circularly polarized light and FM modulation suffers from the effects of population dilution and high buffer-gas pressure. Accordingly, it has a very small resonance signal. As for the power consumption of a conventional passive atomic clock, the local oscillator and the microwave circuitry can be a major draining source because of the complexity of the microwave circuitry and feedback loops of the passive-type atomic clocks. For a portable atomic-clock device, relatively high power consumption can reduce the battery lifetime and therefore decrease the utility of the miniature atomic clock.

It is desirable to provide an improved method and system for reducing complexity and power consumption of an atomic clock or magnetometer.

SUMMARY OF THE INVENTION

The problem of conventional CPT has been solved by Push-Pull pumping technique. Push-pull pumping can boost up the CPT signal by a significant factor and therefore effectively improve the performance of CPT atomic clocks. The present invention provides a method and apparatus for operating atomic clocks or magnetometers without a local oscillator and without an electronic feed-back loop for stabilizing the local-oscillator frequency. The atomic-clock signal is directly obtained from self-modulated laser light. The method and system is based on the physics of a push-pull optical pumping technique using an alkali-metal vapor cell placed inside a laser cavity to modulate the laser light at the frequency of the hyperfine resonance. In the laser cavity, a photonic gain medium, such as laser diodes or other kinds, can amplify the photon flux at different optical frequencies. Depending on the cavity configuration, optics may be needed to control the light polarization and the optical bandwidth. A fast photodetector can convert the modulated light into the clock ticking signal in electrical form with some optics.

A laser is a positive feedback amplifier of photons. An alkali-vapor cell inside the laser cavity operates similar to a photonic filter and converter to generate a special lasing mode, which produces the light modulation. Generally, a laser tends to lase in an optical mode, which has the maximum gain or the minimum loss of photons from their round-trip inside the cavity. Without the vapor cell, the lasing spectrum is determined by the characteristics of the laser cavity and the gain profile. With a vapor cell inside the cavity, a steady lasing point is met while the lasing spectrum produces the maximum efficiency of push-pull optical pumping, which makes the vapor cell become the most transparent. At this point, the output laser light is modulated at hyperfine frequency. If a 0-0 hyperfine resonance is chosen for light modulation, the output laser light serves as an atomic-clock signal. If other magnetic field dependent resonances for light modulation are chosen, the output laser light serves as a magnetometer signal.

Preferably, push-pull optical pumping can be used with D1 light of alkali-metal atoms, since D1 pumping light has better efficiency for CPT excitation of ground-state hyperfine coherence of alkali-metal atoms. Push-pull pumping tends to excite the electron spin oscillation at the hyperfine frequency. The oscillation of the electron spin of the alkali-metal vapor can modulate the light intensity. In a closed-loop laser cavity, the light modulation from the vapor can be amplified by the gain medium, and it generates a steady push-pull pumping light. The initial excitation of spin oscillation can be produced by the laser noise, laser instability, and the like. Spontaneous push-pull pumping is generated if the round-trip gain of the push-pull pumping light is greater than one, thereby providing a self-modulated laser system.

The invention will be more fully described by reference to the following drawings.

DETAILED DESCRIPTION

Figure 1:
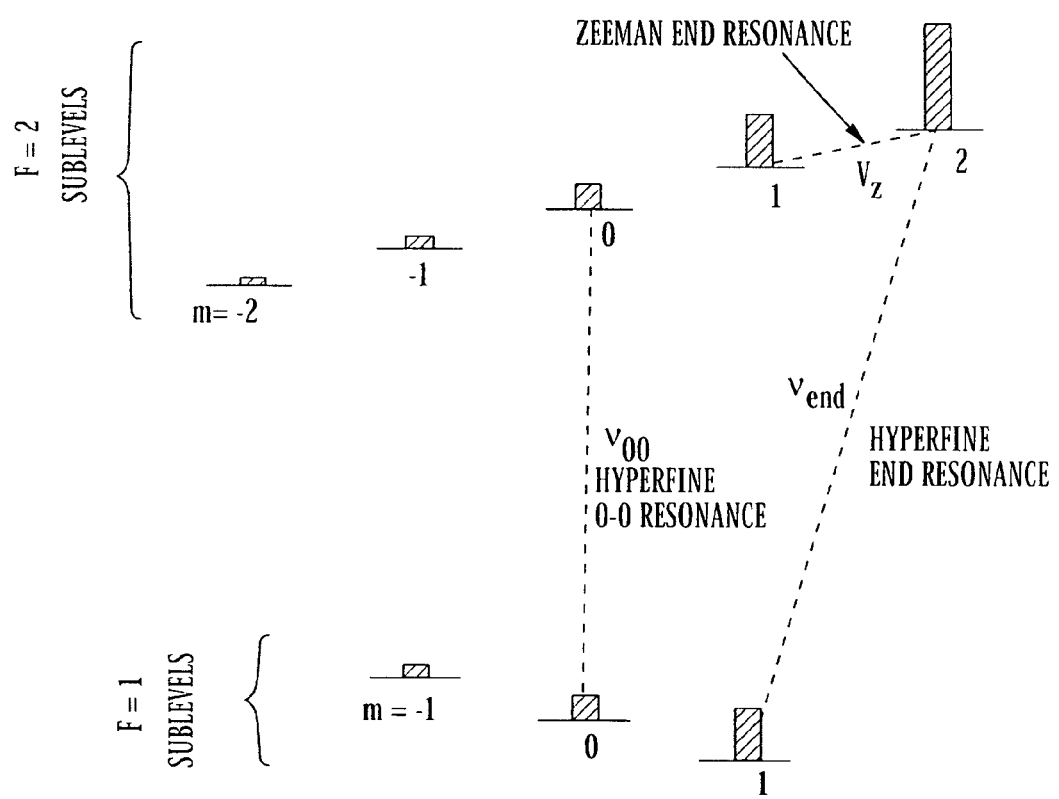
FIG. 1 is a schematic diagram of the ground-state hyperfine energy levels of a representative alkali-metal atom with nuclear spin I=3/2.
Figure 2:
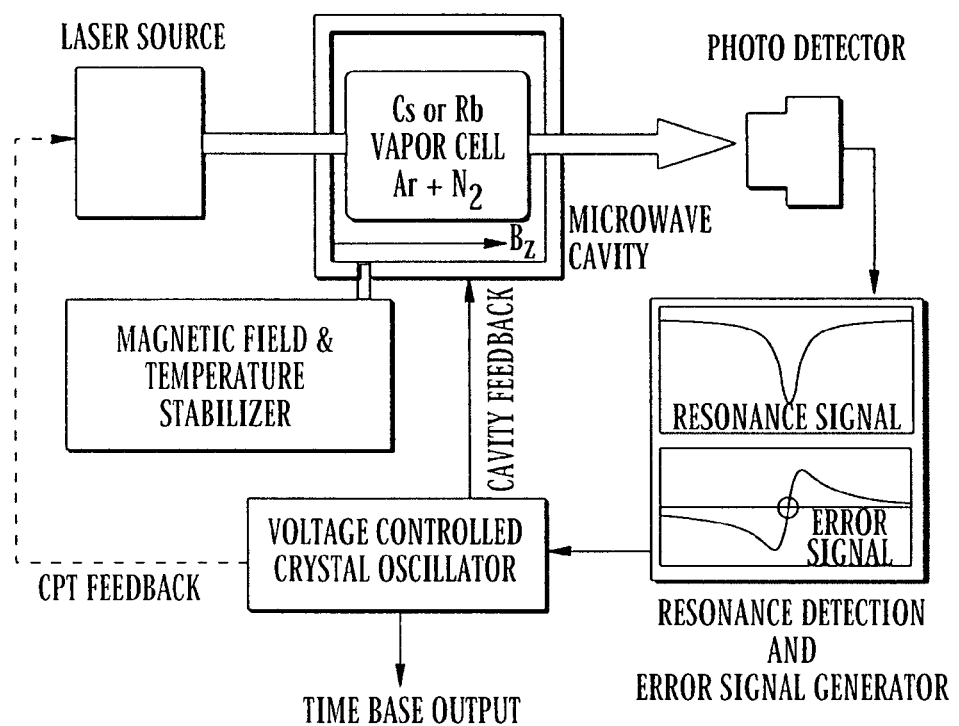
FIG. 2 is a schematic diagram of a prior art passive, gas-cell, atomic clock system.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
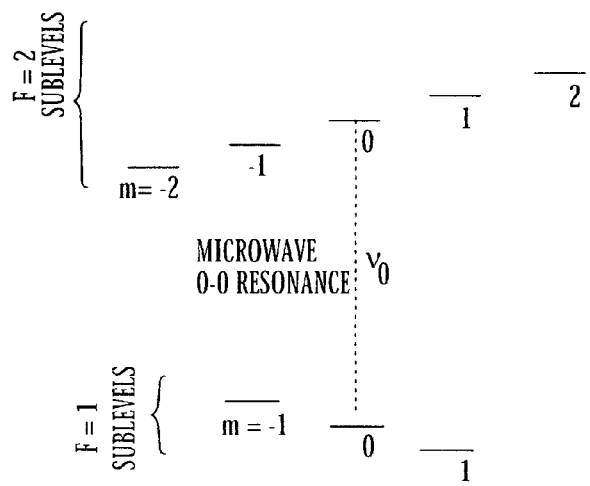
FIG. 3 is a flow diagram of a method for operating an atomic clock or magnetometer using a push-pull pumping technique.

FIG. 3 is a flow diagram of a method for operating an atomic clock or magnetometer 10 using a push pull pumping technique in accordance with the teachings of the present invention. In block 11, atoms are generated in a vapor phase or in an atomic beam, their ground state split by the electron-nuclear hyperfine interaction. The atomic vapor can be mixed with a buffer gas or gases, such as nitrogen or any of the noble gases, or a mixture thereof. A weak external magnetic field is needed to define the quantization direction at the location of the atoms. The quantum numbers F and m are used to label the ground-state sublevels of the alkali-metal atom. Here F is a quantum number of the total spin, electron plus nuclear, of the atom, and m, is the azimuthal quantum number, the projection of the total spin along the direction of the magnetic field. The possible values of F are F=I+1/2=a or F=I−1/2=b, and the possible values of m are m=F, F−1, F−2, . . . −F.

In block 12, to excite coherent population trapping (CPT) 0-0 resonances in alkali-metal vapors, the alkali-metal atoms in the ground state are optically pumped with light of alternating polarization. The light of alternating polarization provides photons having spin that alternates its direction at a hyperfine frequency of the atoms at the location of the atoms. Light of alternating polarization is defined within the scope of this invention as an optical field, the electric field vector of which or some component thereof at the location of the atoms alternates at a hyperfine frequency of the atoms between rotating clockwise and rotating counter-clockwise in the plane perpendicular to the magnetic field direction. In one embodiment, the polarization of the light interacting with the atoms alternates from magnetic right circular polarization (mRCP) to magnetic left circular polarization (mLCP). mRCP light is defined as light for which the mean photon spin points along the direction of the magnetic field so that an absorbed photon increases the azimuthal angular momentum of the atom by 1 (in units of $\hbar$). mLCP is defined as light for which the mean photon spin points antiparallel to the direction of the magnetic field so that an absorbed photon decreases the azimuthal angular momentum of the atom by 1 (in units of $\hbar$). For light beams propagating antiparallel to the magnetic field direction, mRCP and mLCP definitions are equivalent to the commonly used RCP and LCP definitions, respectively. However, for light beams propagating along the magnetic field direction, mRCP is equivalent to LCP, and mLCP is equivalent to RCP. In one embodiment, block 12 is performed by intensity or frequency modulating right circularly polarized (RCP) light at a repetition frequency equal to the frequency of the 0-0 resonance and combining it with similarly modulated left circularly polarized (LCP) light which is shifted or delayed relative to the RCP light by a half-integer multiple of the repetition period. Alternatively, the light of alternating polarization is generated by combining two beams of mutually perpendicular linear polarizations, wherein optical frequencies of the beams differ from each other by a hyperfine frequency of the atoms. Alternatively, the light of alternating polarization is generated by two counter-propagating beams that produce the electrical field vector at the location of the atoms which alternates at a hyperfine frequency of the atoms between rotating clockwise and rotating counter-clockwise in the plane perpendicular to the light propagation. Alternatively, the light of alternating polarization is generated by a system of spectral lines, equally spaced in frequency by a hyperfine frequency of the atoms wherein each spectral line is linearly polarized and the polarizations of adjacent lines are mutually orthogonal. Alternatively, the light of alternating polarization is generated by generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms.

In block 14, detection of transmission of the light through the alkali-metal vapor is measured. For example, a photo detector can be used to measure transmission of the light through a glass cell containing the alkali-metal vapor and a buffer gas. Alternatively, fluorescence of the alkali-metal vapor is measured. Alternatively, atomic state of the alkali-metal atoms in an atomic beam is analyzed using standard methods. Push-pull optical pumping can be used to improve performance of gas-cell atomic clocks, atomic beam clocks, atomic fountain clocks and magnetometers.

Figure 4:
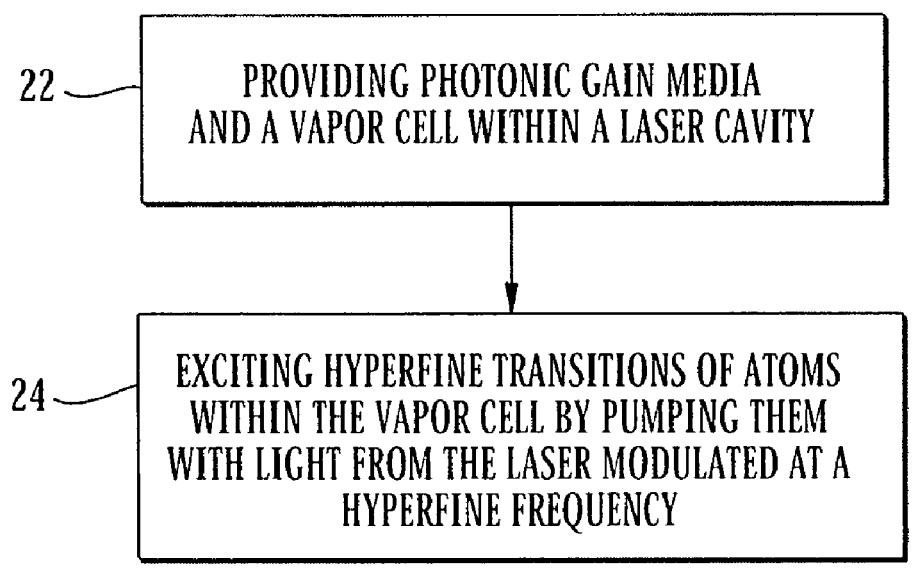
FIG. 4 is a flow diagram of a method for operating a self-modulated laser in accordance with the teachings of the present invention.

FIG. 4 is a flow diagram of a method of operating a self-modulated laser 20 in accordance with the teachings of the present invention. In block 22, one or more photonic gain media and a vapor cell are provided within a laser cavity. Example gain mediums include electronic pumped semiconductors, such as an edge-emitting laser diode or a vertical cavity surface emitting laser diode, or optically pumped gain media, such as a dye or a crystal. Necessary optics can be provided for controlling light polarization and optic bandwidth. Optics can include wave plates, polarization filters, and optical filters. In block 24, hyperfine transitions of atoms within the vapor cell are excited by pumping them with light from said laser modulated at a hyperfine frequency. A method and system for operating an atomic clock or magnetometer can include providing the self-modulated laser comprising gain media and vapor cell within a laser cavity and exciting hyperfine transitions within the vapor cell by pumping them with light from the laser modulated at a hyperfine frequency.

Figure 5:
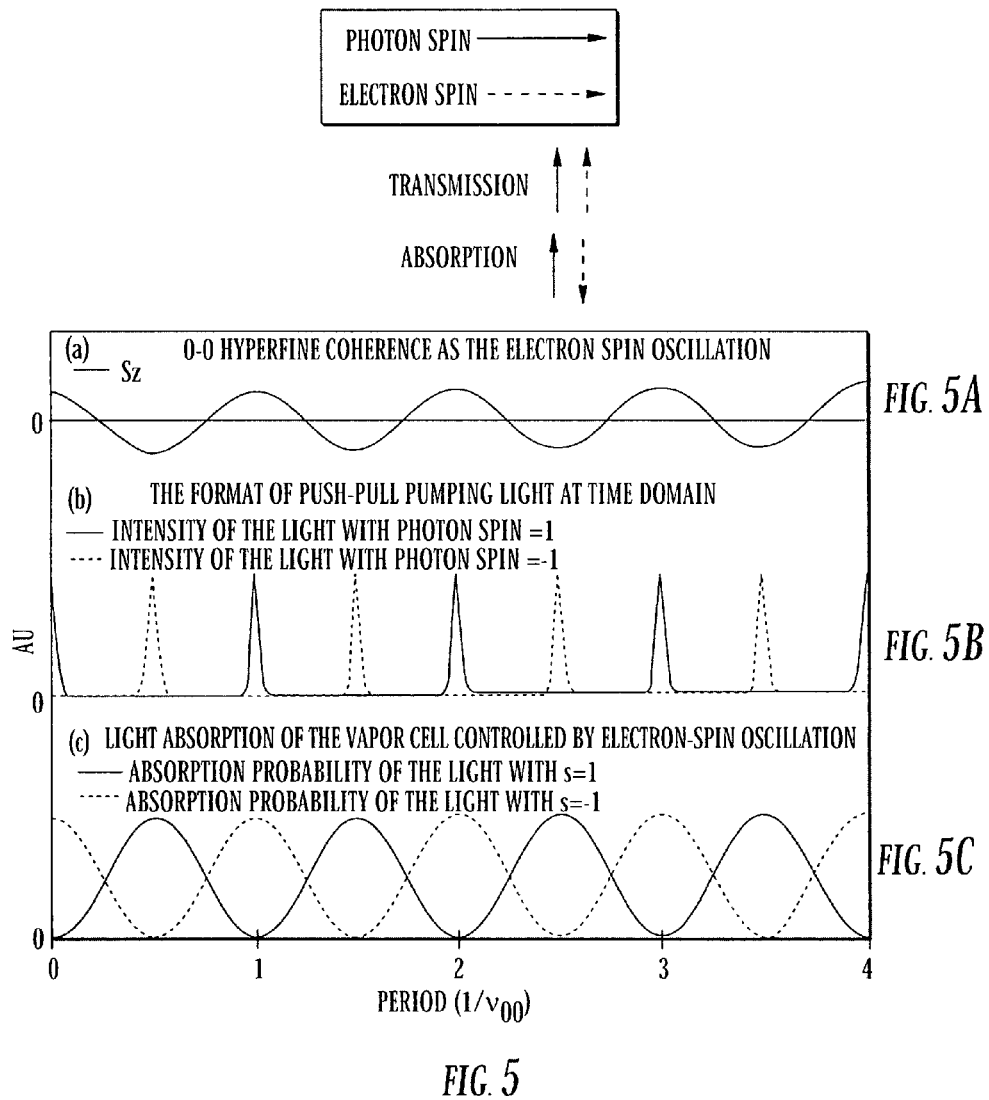
FIGS. 5A-5C are illustrative diagrams of hyperfine coherence as electron spin oscillation, the format of the push-pull pumping light at time domain, and the light absorption of the atomic vapor modulated by the spin oscillation.

FIGS. 5A-5C is an illustration of how electron spin interacts with the D1 pumping light, how the electron spin oscillation or precession is synchronized by the push-pull pumping, and how the electron spin modulates the light absorption of the alkali-metal vapor. The D1 pumping light tends to align the orientation of electron spin shown in FIG. 5A with the orientation of the photon spin, s shown in FIG. 5B. Push-pull pumping has light pulses interlaced by s=1 and s=−1 pulse, and the time interval between the two adjacent pulses is equal to the half period of the hyperfine cycle, $1/(2v_{00})$. The pulse width of push-pull pumping light is determined by the buffer-gas pressure inside the vapor cell. By setting the push-pull pumping beam parallel to the magnetic field (z-direction), a strong 0-0 coherence is excited, which is observed as electron spin oscillation along the z-direction. The electron spin oscillation also causes the time-dependent light absorption of the alkali-metal vapor for different photon spins as shown in FIG. 5C. FIGS. 5A-5C illustrate that there is maximum transparency of the vapor cell by employing push-pull pumping.

Figure 6:
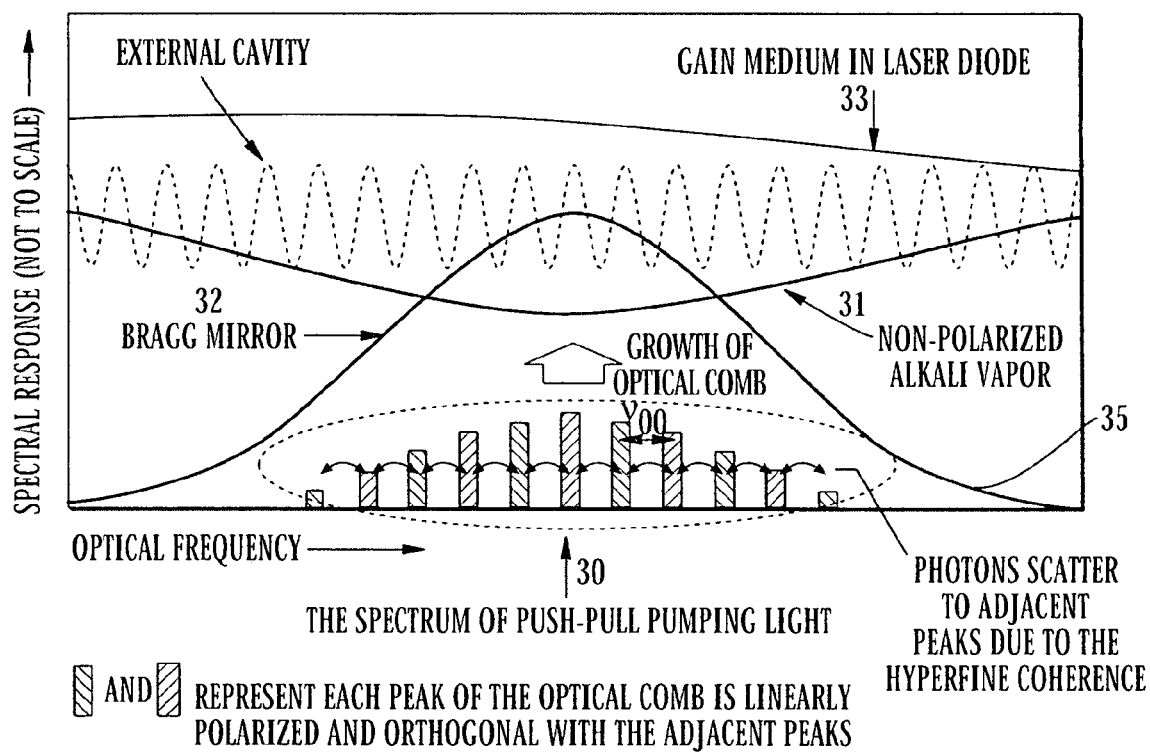
FIG. 6 is an illustrative diagram of the spectrum of push-pull pumping light inside the vapor cell and the spectral response of the entire laser system.

FIG. 6 describes the spectrum of push-pull pumping light at the frequency domain and also the spectral response of the self-modulated laser system. The push-pull pumping light of 0-0 coherence can be described as an optical comb in the spectrum. The optical comb refers to a plurality of peaks separated by $v_{00}$. The spacing of optical comb 30 is equal to the 0-0 hyperfine frequency. Each optical peak of optical comb 30 is linearly polarized and orthogonal to the adjacent peaks. The bandwidth of optical comb 30 is limited by the buffer-gas pressure inside vapor cell 31 and the gain bandwidth. For a self-modulated laser system, the spectral response due to different causes is summarized in FIG. 6. Generally, the gain bandwidth is controlled by Bragg mirror 32 or alternative band-selected optical filters. An initial very small 0-0 hyperfine coherence can be excited by laser instability. Because of the presence of the hyperfine coherence, the alkali-metal vapor can scatter photons from original frequency $v_o$ to new optical frequency $v_o \pm v_{00}$. With favorable conditions, scattered photons with a new frequency can be increased by the photonic gain medium 33, such as the laser diode. Therefore, an optical comb of push-pull pumping light grows inside the gain bandwidth 35. The growth of the optical comb represents increased push-pull pumping light. A stronger push-pull pumping light generates stronger hyperfine coherence. Eventually, the laser is steadily modulated at the hyperfine frequency. It is advantageous for the spacing of the optical comb to be commensurate with the cavity mode. For laser modulating at other field-dependent hyperfine frequency, a similar optical comb is generated, but the polarization pattern of the optical comb can be different.

The optical comb generated by the self-modulated laser has comb spacing locked by the hyperfine frequency. Unlike the optical comb produced by regular comb laser, the comb spacing has to be locked to an external reference. An extended application of the alkali-vapor self-modulated laser is to produce a stable optical frequency as the optical clock. To produce a stable optical frequency of the laser light, the spectral position of the optical comb has to be locked. For an optical clock, the optical frequency of one of the comb peaks can be locked to the multiple of the hyperfine frequency by feedback controlling of the laser cavity. The optical frequency, $f_n$, of the comb peak is stabilized by the step of feedback controlling the laser cavity to obtain $f_n = n v_h$, wherein n is an integer number, and $v_h$ is the hyperfine frequency. Usually the optical frequency is about $10^{14}$-$10^{15}$ Hz and the hyperfine frequency is about $10^9$-$10^{10}$ Hz. Hence the integer number n is a value between $10^4$ and $10^6$. Therefore a stable optical frequency light source is generated. Such stable light source can have a great application in any kinds of precision measurements.

FIGS. 7A-7D show possible embodiments of cavity configurations for self-modulated laser systems 40-70. Four representative cavity configurations are described as examples with only one gain medium in the laser cavity. It is understood that two or more gain media are able to be incorporated inside the cavity. Self-modulated laser system 40 uses polarization gain medium 42, such as an electronically pumped semiconductor, for example, quantum well heterojunction edge-emitting laser diode (ELD). Polarization gain medium 42 outputs light with linear polarization. In order to generate the alternation of photon spin, two quarter wave plates 43a, 43b are used inside laser cavity 41. Vapor cell 44 is positioned, where the laser beam has the maximum alternation of the light polarization, between quarter wave plates 43a, 43b. Bragg mirror 45 and output coupler 46 recombine beams so that they emerge as a single beam of alternating circular polarization. The transmission of light through external cavity 41 is measured with photodiode 48. In this embodiment, the cavity mode is used to achieve push-pull pumping. The effective round-trip time of push-pull pumping light is about the multiple of the hyperfine period. The laser cavity operates as a resonator to excite the self modulation. Hence, the cavity pulling effect needs to be considered. Generally, the frequency shift of the modulation frequency due to the change of the cavity length is small. For example, let $\Delta v$ be the shift of the modulation frequency, and let Δf be the shift of the first harmonic cavity frequency, then it is found that Δν=αγ$T_c$Δf, where γ is the hyperfine linewidth, $T_c$ is the cavity round-trip time, and α is a factor determined by the length of the vapor cell and the vapor density.

Self-modulated laser system 50 uses polarization-diverse gain medium 52. Light with any polarization can be amplified by this type of gain medium. Polarization diverse gain medium can be made by electronically pumped semiconductors, such as, for example, ELDs and vertical cavity surface emitting laser (VCSEL) diodes. Accordingly, this embodiment does not use quarter wave plates on either side of the vapor cell to achieve the light pumping pattern as shown in FIG. 6. The combination of a quarter wave plate and a linear polarizer is for the photodetector to detect light with the photon spin of only s=1 or only s=−1. The commensuration of the cavity mode to the hyperfine frequency is used.

Self-modulated laser system 60 uses ring cavity 61. In this embodiment, photons are moving to one direction. Polarization-diverse gain medium 62 is used for generating the pumping pattern shown in FIG. 6. Narrow band optical filter 64 inside cavity 61 operates in a similar manner as the Bragg mirror described above for other configurations. Only the laser light in the frequency range of narrow band optical filter 64 is allowed to circulate in ring cavity 61. The cycling period of ring cavity 61 is about a multiple of the hyperfine period. This embodiment has the advantage of having the least cavity-pulling effect, since the alkali-metal vapor is filled inside the entire cavity.

Self-modulated laser system 70 uses gain medium 42, vapor cell 44, Bragg mirror 45, and output coupler 46 compacted together. The cavity length is much shorter so that the round-trip time is much less than the hyperfine period. In this embodiment, the generation of the push-pull pumping light relies on the intrinsic property of the gain medium. For example, by using a four-level diagram to describe the optical transitions of the gain medium, the amplifications of σ+ and σ− light depend on two different optical transitions, which have the difference of azimuthal quantum number Δm=+1 and Δm=−1. By a proper design of the relaxation properties of the spin-dependent quantum levels of the gain medium, the spontaneous push-pull pumping can be established. An advantage of this embodiment is the very compact size of the self-modulated laser system, since the cavity length is not limited by the hyperfine frequency. With a proper design of the semiconductor gain medium and the miniature laser cavity, a millimeter or sub-millimeter scale photonic clock (without local oscillator) can be achieved.

It is appreciated that the cavity configurations shown in FIGS. 7A-7D are only for examples. Other types of cavity design that realize the self modulation of the laser beam into the optical comb by using alkali-metal vapor cell is considered to be within the teachings of the present invention.

Figure 7:
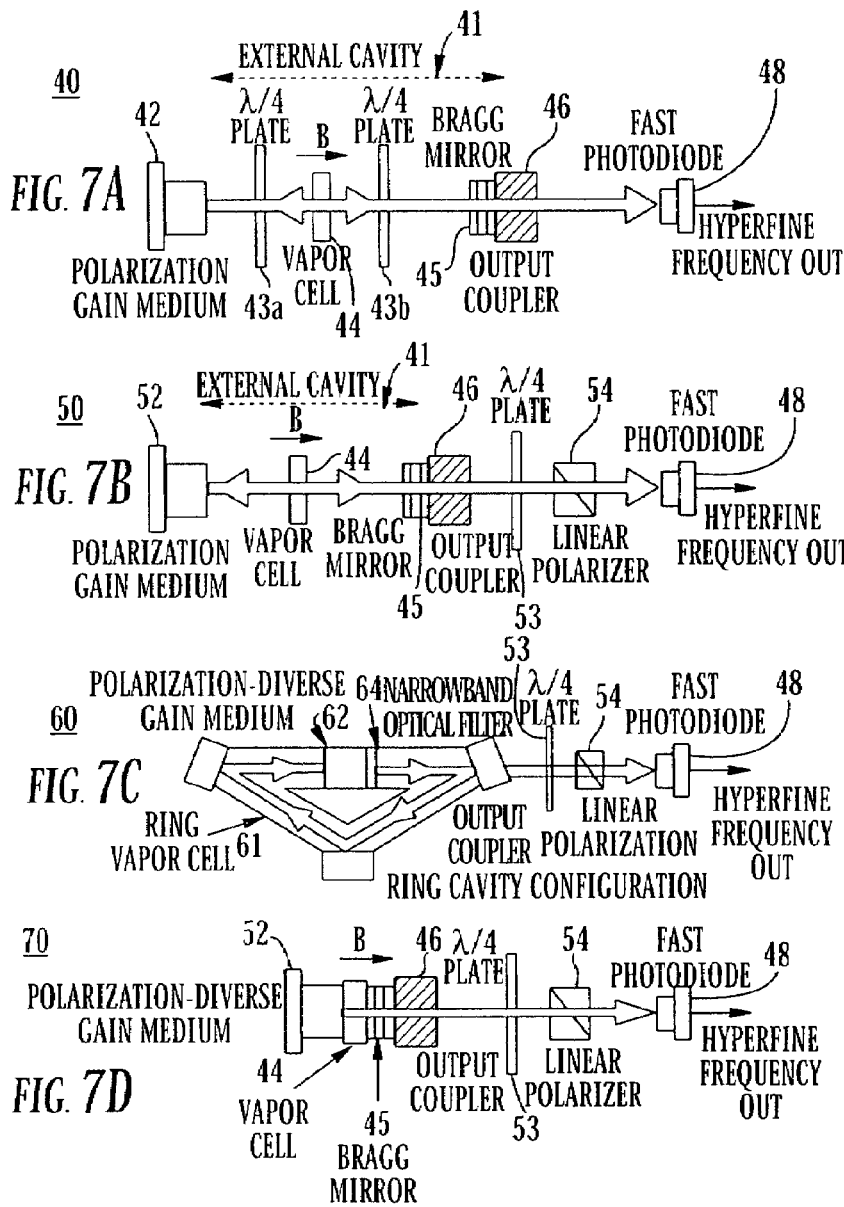
FIGS. 7A-7D are schematic diagrams of embodiments of cavity configurations for a laser modulated at hyperfine frequency.
Figure 8:
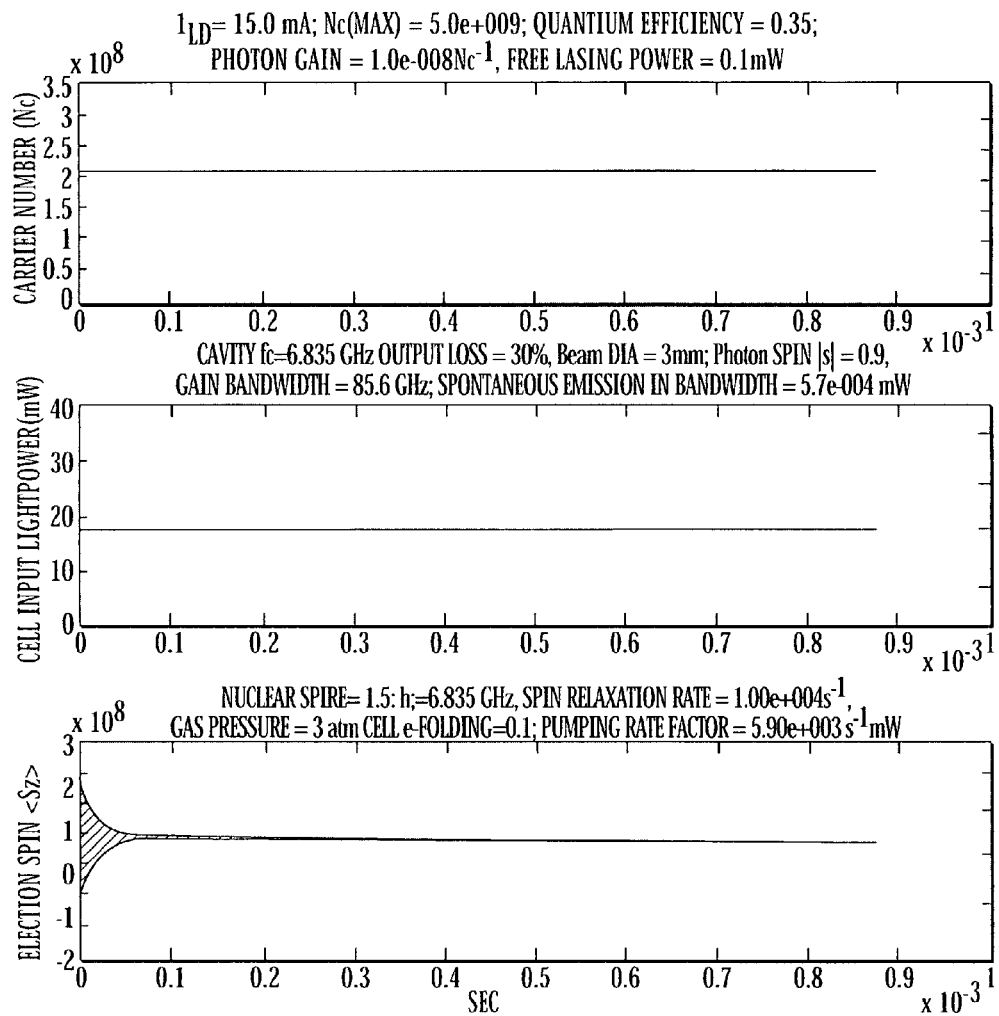
FIG. 8 is a plot of simulation result of a diode-laser not modulated by the $^{87}$Rb cell using the configuration of FIG. 7A when the gas cell has insufficient vapor density.
Figure 9:
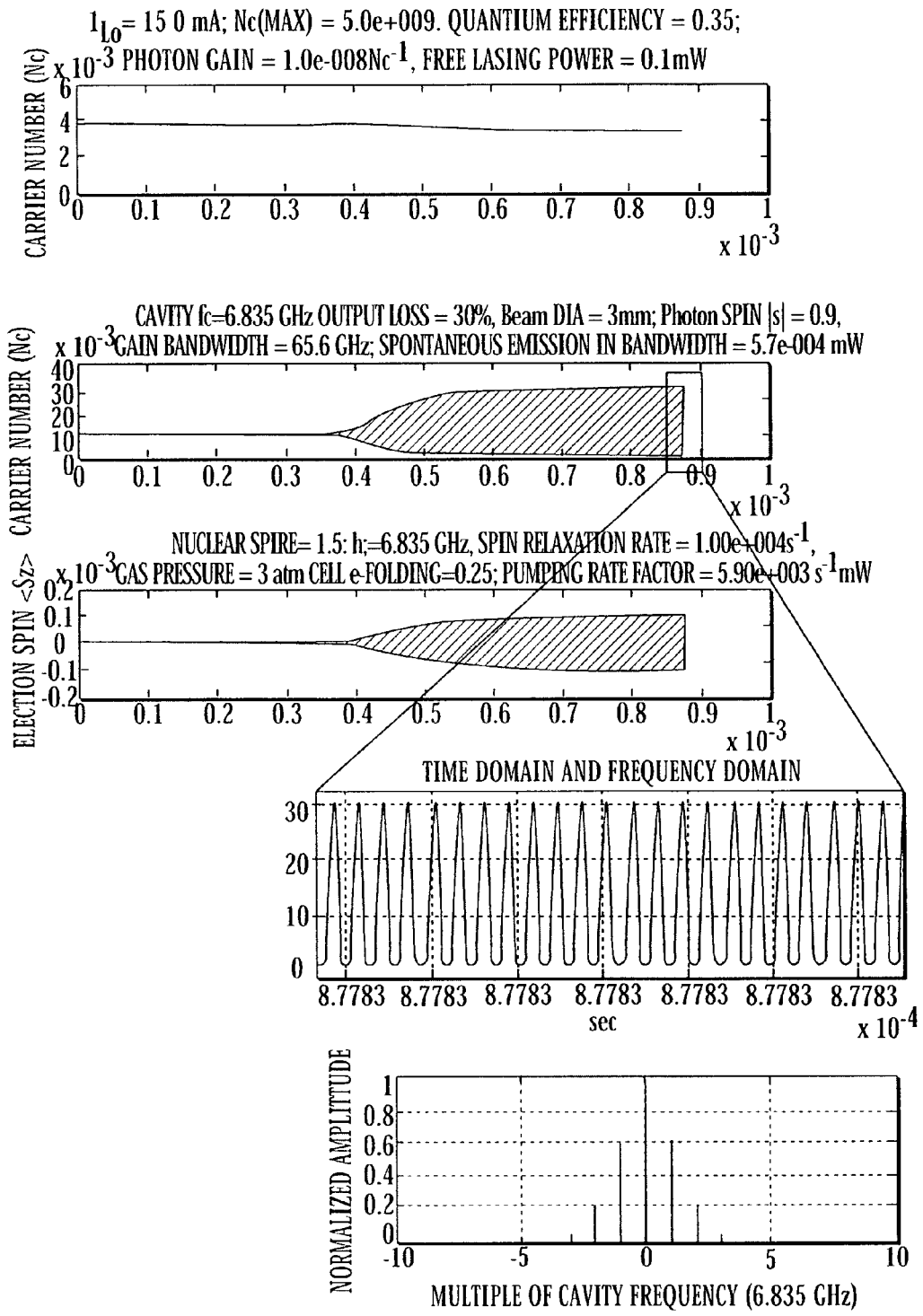
FIG. 9 is a plot of the simulation result of a diode-laser modulated by the $^{87}$Rb cell using the configuration of FIG. 7A when the gas cell has sufficient vapor density.
Figure 10:
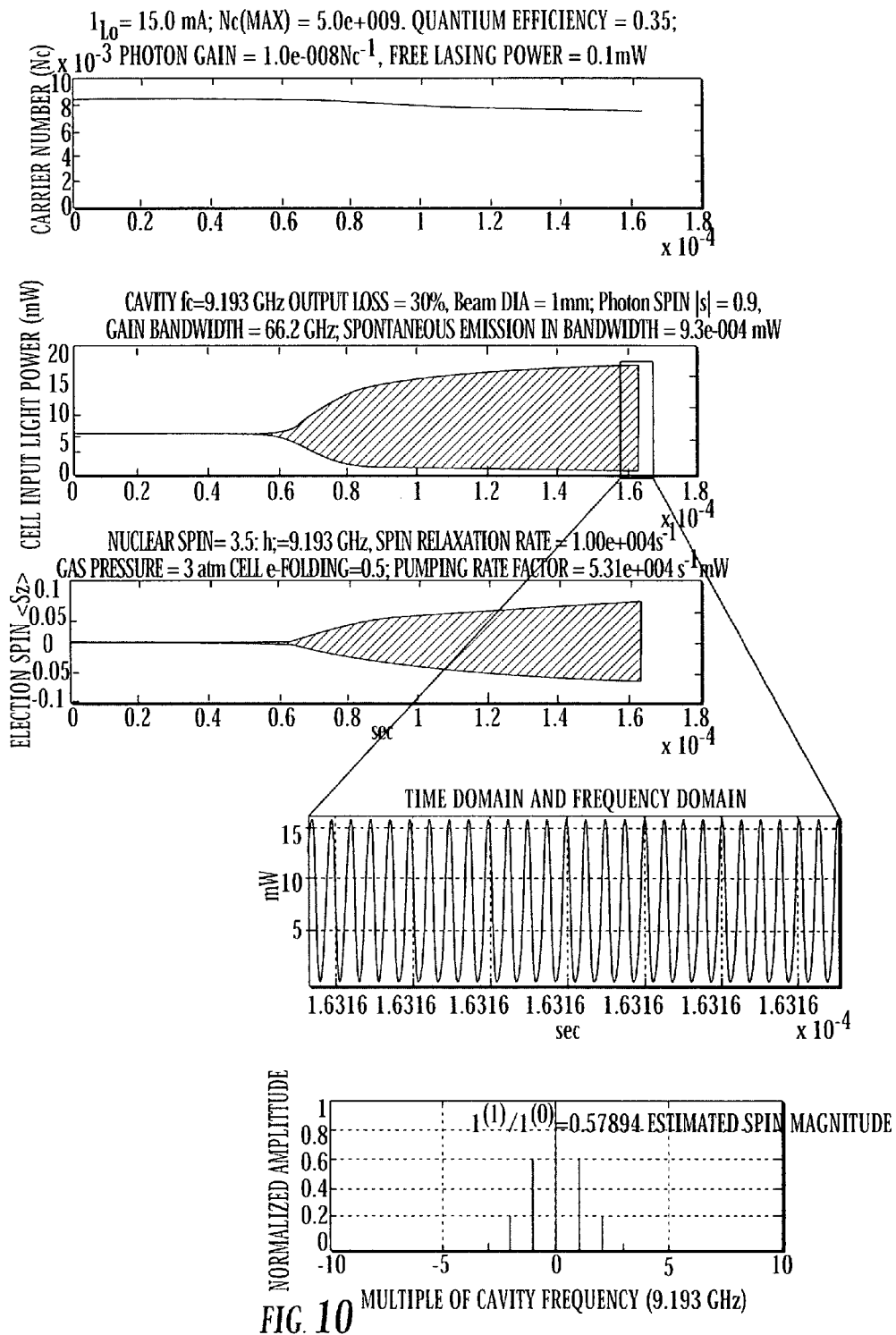
FIG. 10 is a plot of the simulation result of a diode-laser modulated by the $^{133}$CS cell using the configuration of FIG. 7A when the gas cell has sufficient vapor density.

FIG. 8, FIG. 9, and FIG. 10, show the results of computer simulations of the self-modulated laser system of FIG. 7A. There are three panels for each figure, and the horizontal axis is the increase of time. The top panel shows the relative carrier density inside the EDL as a function of time. The middle panel shows the laser intensity inside the cavity as a function of time. The bottom panel shows the electron-spin amplitude due to the 0-0 hyperfine coherence along the z-direction as a function of time. For FIG. 8, it is assumed that the vapor cell contains $^{87}$Rb with 3 atm buffer-gas pressure. The gain bandwidth is about 66 GHz. The beam diameter is 3 mm. The purity of photon spin is 90%. The loss from the output coupler is 30%. The vapor cell has optical thickness of 0.1 e-folding. Initially, a small spin oscillation is observed in the scale of $10^{-8}$ due to the stepping up laser intensity when laser just turns on. The spin oscillation cannot maintain and die away because of the insufficient vapor density. By increasing the optical thickness of the vapor cell to 0.25 and remaining other conditions the same, it was found that a strong spin oscillation building up in about a millisecond after turning on the laser, and the light is also modulated at the hyperfine frequency as shown in FIG. 9. FIG. 10 shows one of the simulation results for $^{133}$CS. Cesium has high nuclear spin than rubidium. It requires high vapor density to generate spontaneous push-pull pumping inside the cavity. If the optical thickness is increased to 0.5, e-folding, and the beam diameter is reduced to 1 mm. Spontaneous push-pull pumping starts in about 0.1 millisecond after turning on the laser. For all simulations described above, the tolerance of the mismatching between the cavity mode and the hyperfine frequency is about 0.5%. Beyond the tolerance, spontaneous push-pull pumping cannot be produced.

Figure 11:
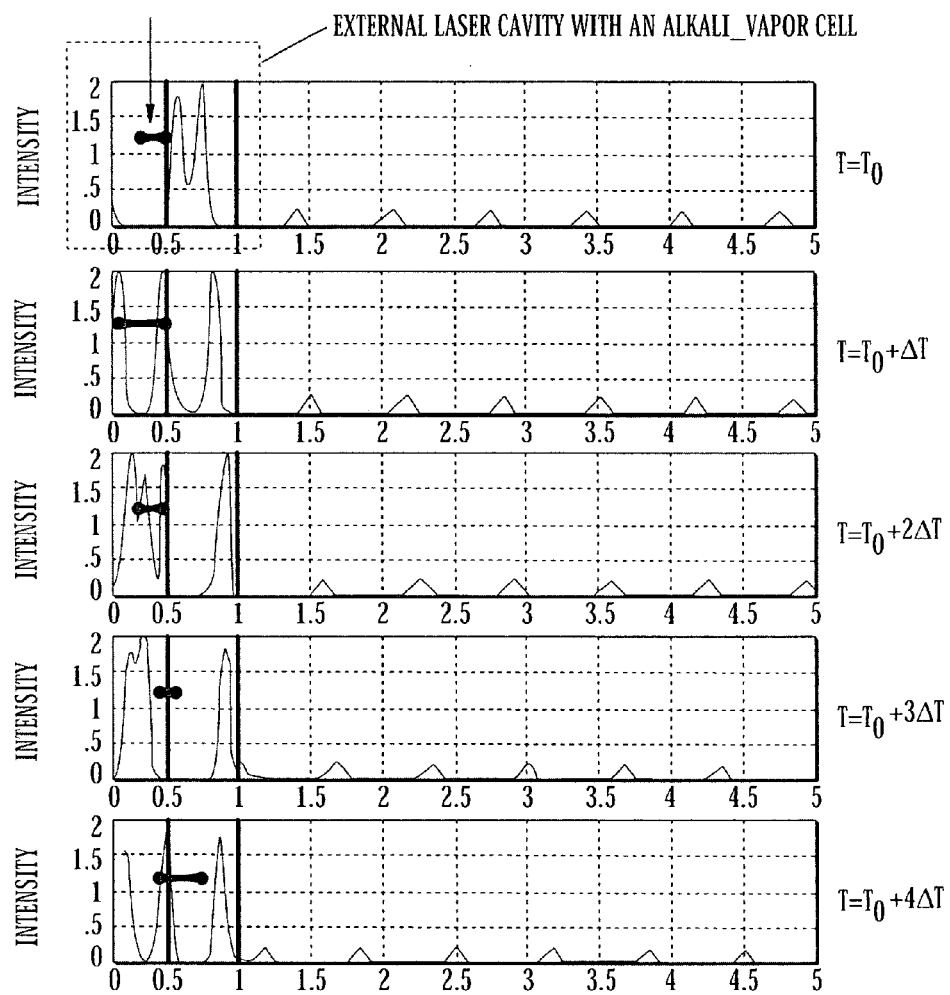
FIG. 11 is an illustrative animation of the laser intensity and electron spin of alkali-metal atoms when the laser is steadily modulated by the vapor cell.

FIG. 11 illustrates the intensity pattern along the cavity axis at different time points when a steady self modulation is built up. In this simulation, the round-trip time of the cavity is equal to three times hyperfine period. The vapor cell is placed at the center of the laser cavity. It is shown that each time the light pulse hits the vapor cell, there is maximum spin magnitude. The laser continuously outputs light pulse repeating at the hyperfine frequency. The light pulse signal can be easily converted into an electrical ticking signal as a clock. For using the self-modulated laser as the atomic clock, the gain medium and the vapor cell have to be temperature stabilized; the ambient magnetic field of the laser cavity has to be stabilized; the cavity length also has to be stabilized. The stabilization of magnetic field and the temperature can be achieved by using a magnetic-field sensor and a temperature sensor with two feedback loops to compensate the changes of those two quantities. The cavity length can be stabilized by a feedback adjustment of the cavity length to obtain a maximum light modulation.

Figure 12:
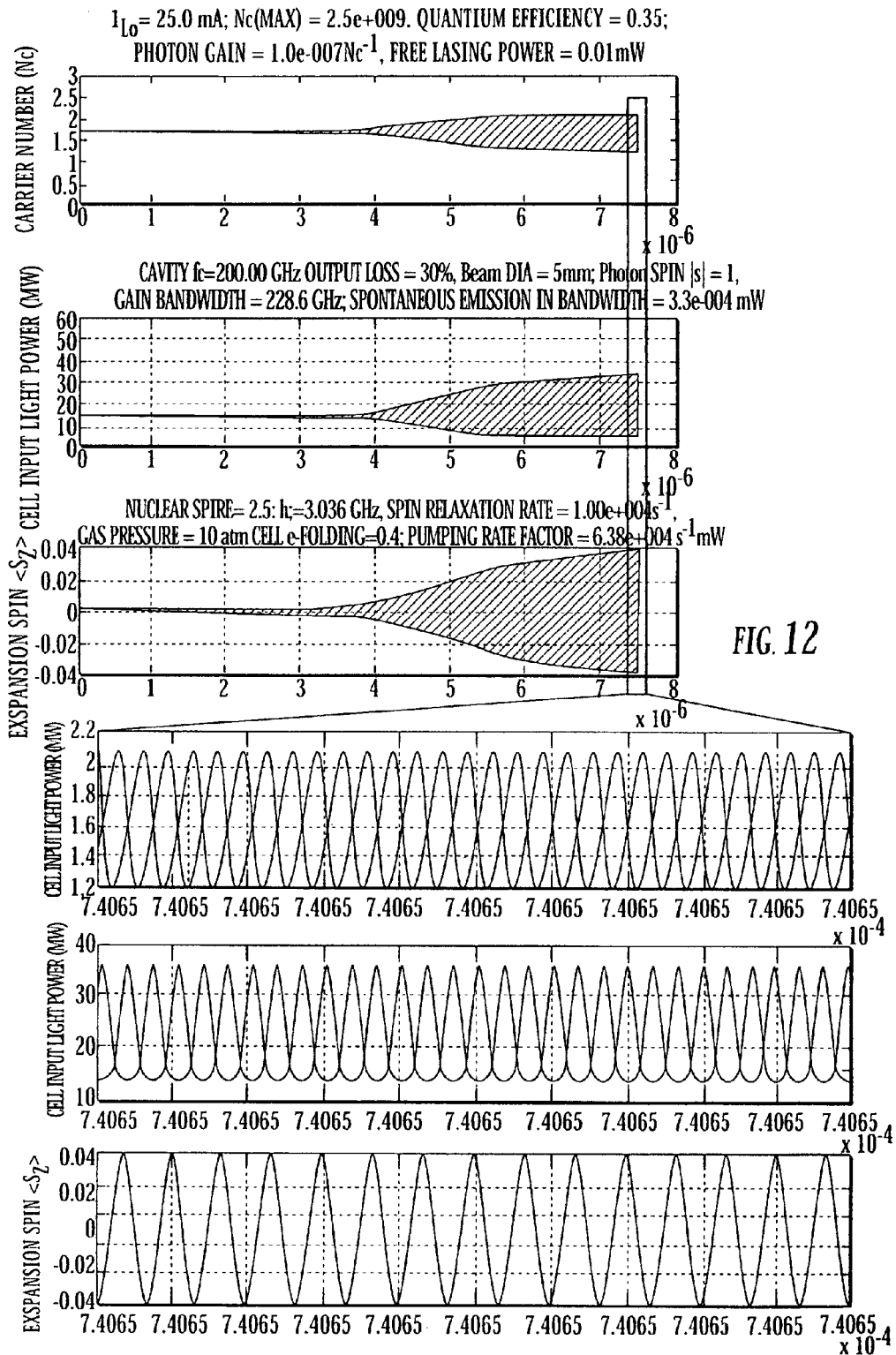
FIG. 12 is a plot of the simulation result of a polarization-diverse laser diode modulated by the $^{85}$Rb cell using the configuration of FIG. 7D.

FIG. 12 shows results of a computer simulation of the self-modulated laser system 70 of FIG. 7D. The vapor cell is assumed to have $^{85}$Rb. The effective cavity round-trip time is 5 ps, which is much shorter than the hyperfine period, ~330 ns, of $^{85}$Rb. It is shown in FIG. 12 that the self-modulated laser light is alternating between σ+ polarization (solid line) and σ-polarization (dotted line). The generation of spontaneous push-pull pumping inside the vapor cell strongly depends on some physical parameters of the laser diode, such as the differential gain, the carrier lifetime, the excited-state spin relaxation rate of the gain medium, and the carrier pumping rate.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A method for operating a self-modulated laser comprising:
   providing one or more photonic gain media and a vapor cell within a laser cavity; and exciting ground-state hyperfine transitions of atoms within said vapor cell by pumping them with light from said self-modulated laser being modulated at a hyperfine frequency.

2. The method of claim 1 wherein an optical comb of the light from the self-modulated laser is automatically generated.

3. The method of claim 1 wherein push-pull pumping inside the vapor cell is spontaneously generated.

4. The method of claim 1 wherein an electric field of the pumping light inside the vapor cell is alternating its polarization at the hyperfine frequency.

5. The method of claim 1 wherein photon spin of the pumping light inside the vapor cell is oscillating synchronously with electron spin oscillation or precession of the atoms.

6. The method of claim 1 wherein the photonic gain media is a type of electronically pumped semiconductors.

7. The method of claim 6 wherein the electronically pumped semiconductor is an emitting laser diode.

8. The method of claim 1 wherein the photonic gain media is a type of optically pumped gain media.

9. The method of claim 8 wherein the optically pumped gain media is a dye or a crystal.

10. The method of claim 1 wherein the vapor cell is an alkali-metal vapor cell.

11. A method for operating an atomic clock comprising the steps of:
    a) providing a self-modulating laser comprising gain media and a vapor cell within a laser cavity; and
    b) exciting hyperfine ground-state transitions of atoms within said vapor cell by pumping them with light from said self-modulated laser being modulated at a hyperfine frequency.

12. The method of claim 11 further comprising the step of:
    converting output modulated light from step b) into an electric signal; and
    providing said electric signal as a clock ticking signal for said atomic clock.

13. A method of operating a magnetometer comprising the steps of:
    a) providing a self-modulating laser comprising gain media and a vapor cell within a laser cavity; and
    b) exciting ground-state hyperfine transitions of atoms wherein said vapor cell by pumping them with light from said self-modulated laser being modulated at a hyperfine frequency.

14. The method of claim 13 further comprising the step of:
    using said output modulated light from step b) for measuring a magnetic field.

15. The method of claim 13 wherein the vapor cell is an alkali-metal vapor cell.

16. A self-modulated laser comprising:
    one or more photonic gain media and a vapor cell within a laser cavity wherein said vapor cell modulates said self-modulated laser at a hyperfine frequency.

17. The laser of claim 16 wherein an optical comb of the light from the laser is automatically generated.

18. The laser of claim 16 wherein push-pull pumping inside the vapor cell is spontaneously generated.

19. The laser of claim 16 wherein an electric field of the pumping light inside the vapor cell is alternating its polarization at the hyperfine frequency.

20. The laser of claim 16 wherein photon spin of the pumping light inside the vapor cell is oscillating synchronously with electron spin oscillation or precession of the atoms.

21. The laser of claim 16 wherein the photonic gain media is a type of electronically pumped semiconductor.

22. The laser of claim 21 wherein the electronically pumped semiconductor is an emitting laser diode.

23. The laser of claim 16 wherein the photonic gain media is a type of optically pumped gain media.

24. The laser of claim 23 wherein the optically pumped gain media is a dye or a crystal.

25. The laser of claim 16 further comprising a first quarter wave plate positioned between said photonic gain media and one side of said vapor cell and a second quarter wave plate positioned on an opposite side of said vapor cell, wherein said vapor cell positioned wherein the laser beam has a maximum alternation of light polarization.

26. The laser of claim 25 further comprising a Bragg mirror and output coupler to recombine beams from said second quarter wave plate.

27. The laser of claim 16 wherein said vapor cell comprises a ring cavity.

28. The laser of claim 27 further comprising:
    a narrow band optical filter within said ring cavity.

29. The laser of claim 16 wherein said one or more photonic gain media and said vapor cell are compacted together with a Bragg mirror and output coupler.

30. An atomic clock comprising:
    photonic gain media and a vapor cell within a laser cavity wherein said vapor cell modulates said laser at a hyperfine frequency for providing a self-modulated laser.

31. The atomic clock of claim 30 wherein an optical comb of the light from the laser is automatically generated.

32. The atomic clock of claim 30 wherein push-pull pumping inside the vapor cell is spontaneously generated.

33. The atomic clock of claim 30 wherein an electric field of the pumping light inside the vapor cell is alternating its polarization at the hyperfine frequency.

34. The atomic clock of claim 30 wherein photon spin of the pumping light inside the vapor cell is oscillating synchronously with electron spin oscillation or precession of the atoms.

35. The atomic clock of claim 30 wherein the photonic gain media is a type of electronically pumped semiconductor.

36. The atomic clock of claim 35 wherein the electronically pumped semiconductor is an emitting laser diode.

37. The atomic clock of claim 30 wherein the photonic gain media is a type of optically pumped gain media.

38. The atomic clock of claim 37 wherein the optically pumped gain media is a dye or a crystal.

39. The atomic clock of claim 30 further comprising:
    means for converting output modulated light into an electric signal; and
    means for providing said electric signal as a clock ticking signal for said atomic clock.

40. A magnetometer comprising:
    photonic gain media and a vapor cell within a laser cavity wherein said vapor cell modulates said laser at a hyperfine frequency for providing a self-modulated laser.

41. The magnetometer of claim 40 wherein an optical comb of the light from the laser is automatically generated.

42. The magnetometer of claim 40 wherein push-pull pumping inside the vapor cell is spontaneously generated.

43. The magnetometer of claim 40 wherein an electric field of the pumping light inside the vapor cell is alternating its polarization at the hyperfine frequency.

44. The magnetometer of claim 40 wherein photon spin of the pumping light inside the vapor cell is oscillating synchronously with electron spin oscillation or precession of the atoms.

45. The magnetometer of claim 40 wherein the photonic gain media is a type of electronically pumped semiconductor.

46. The magnetometer of claim 15 wherein the electronically pumped semiconductor is an emitting laser diode.

47. The magnetometer of claim 40 wherein the photonic gain media is a type of optically pumped gain media.

48. The magnetometer of claim 47 wherein the optically pumped gain media is a dye or a crystal.

49. The magnetometer of claim 15 further comprising:
means for using said output modulated light for measuring a magnetic field.

50. A method of generating a hyperfine-frequency stabilized light source comprising the steps of:
 a) providing a self-modulating laser comprising gain media and a vapor cell within a laser cavity; and
 b) exciting hyperfine transitions of atoms within said vapor cell by pumping them with light from said laser modulated at a hyperfine frequency.

51. The method of claim 50 further comprising the step of:
using an optical comb of output modulated light from step b) for stabilizing an optical frequency of one peak of the optical comb.

52. The method of claim 51 wherein the optical frequency, $f_n$, of the comb peak is stabilized by the step of feedback controlling the laser cavity to obtain $f_n = n v_h$, wherein n is an integer number, and $v_h$ is the hyperfine frequency.

* * * * *